United States Patent [19]
Smith

[11] Patent Number: 5,933,309
[45] Date of Patent: Aug. 3, 1999

[54] APPARATUS AND METHOD FOR MONITORING THE EFFECTS OF CONTACT RESISTANCE

[75] Inventor: Douglas G. Smith, Jericho, Vt.

[73] Assignee: International Business Machines Corporation, Armonk, N.Y.

[21] Appl. No.: 09/088,568

[22] Filed: Jun. 2, 1998

[51] Int. Cl.$^6$ .................................................. H02H 3/26
[52] U.S. Cl. ............................ 361/88; 361/86; 324/715
[58] Field of Search ................................ 361/88, 91, 78, 361/86; 324/713–715, 718, 761

[56] References Cited

U.S. PATENT DOCUMENTS

| | | | |
|---|---|---|---|
| 5,365,180 | 11/1994 | Edelman | 324/715 |
| 5,491,424 | 2/1996 | Asar et al. | 324/715 |
| 5,498,972 | 3/1996 | Haulin | 324/765 |
| 5,587,865 | 12/1996 | Bielig et al. | 361/91 |
| 5,600,249 | 2/1997 | Yagi et al. | 324/537 |
| 5,838,160 | 11/1998 | Beaman et al. | 324/754 |

FOREIGN PATENT DOCUMENTS 61-152034  7/1986  Japan .

*Primary Examiner*—Sally C. Medley
*Attorney, Agent, or Firm*—James M. Leas

[57] ABSTRACT

An electronic module tester measures the difference between the voltage provided by the tester during testing and the voltage actually delivered to an electronic device. The difference corresponds to a voltage drop associated with the contamination contact resistance. This resistance builds up on contact surfaces of the tester as many modules are inserted and extracted. One power line and one ground line from the electronic module are isolated and connected to a voltmeter for a direct measurement of voltage on the device. A comparison is made with the power supply voltage provided by the tester to the device under test. A voltage difference exceeding a predetermined value initiates further action prior to continued testing, such as contact cleaning.

19 Claims, 10 Drawing Sheets

APPARATUS AND METHOD FOR MONITORING THE EFFECTS OF CONTACT RESISTANCE

BACKGROUND OF THE INVENTION

1. Field of the Invention

The present invention concerns, in general, a measurement device and method for performing a voltage differential measurement. Particularly, it concerns a device and a method for measuring the effects of contact resistance between a test circuit board and a populated printed circuit board or electronic module to determine if the contact resistance is sufficiently low for testing purposes.

2. Description of Related Art

Contamination on conductive interconnecting contacts can cause significant signal degradation when measured through the contacts. This degradation is a result of contact contamination build-up, commonly referred to as contamination resistance. Contamination is usually found in the formation of a film or layer of material on the contact or plated surface of the contact. Contamination resistance is the electrical resistance caused by various types of contamination films and materials which may become disposed on the electrical contacts and ultimately decrease the conductivity between the contacts.

Importantly, when performing sensitive voltage and current test measurements on Integrated Circuits (ICs), contamination resistance on the interconnecting contacts can lead to incorrect measurements and false failure designations due to a drop in voltage across the contamination resistance or current limited by the same.

High speed microprocessors typically draw large currents. Thus, when these modules are under test, contamination on the interface board I/O pins can provide enough series resistance to reduce the Vdd voltage at the device and increase the ground voltage reducing the device speed. This results in microprocessor devices being sorted into a lower speed category than they are otherwise entitled to be in.

In order to address this problem, it is common to periodically interrupt testing to measure the contact resistance during testing. If such tests reveal that the contact resistance is increasing, contacts are cleaned and testing is then resumed.

Generally, two measurements are made for measuring contact resistance: a 2-terminal measurement and a 4-terminal measurement. In the 2-terminal measurement, a small known current is forced through the circuit and the associated voltage drop is measured. The total resistance, including resistance of both contacts and circuitry therebetween, is then calculated from the voltage to current ratio. In the 4-terminal method, a known current is forced through two outside terminals of a device and a voltage is measured across two inside terminals on the device. The ratio of measured voltage to forced current gives the resistance of the circuitry alone. The difference between these two measurements is the contact resistance. Variations on these measurement techniques have been used to measure the contact resistance value where a known current or voltage can be applied. However, there has been no method of measuring contamination build-up without interrupting the normal operational testing of integrated circuits to provide the known current or voltage. Nor has there been a method of detecting contamination build-up just as it occurs.

SUMMARY OF THE INVENTION

It is therefore an object of the present invention to provide a method of detecting contact contamination during the functional testing of an electronic module.

It is another object of the present invention to improve the testing of electronic components by detecting a voltage drop on the supply line and ground line to the device under test during normal operation of the device.

It is another object of the present invention to monitor contact resistance between a test fixture and contacts of the device under test.

It is yet another object of the present invention to provide a method of measuring the effects of contamination resistance in the voltage supply lines to an electronic component while testing the electronic component.

A further object of the invention is to provide a method for determining when contact cleaning is required based on measuring the detrimental effects of contact contamination resistance during normal testing.

These and other objects, features, and advantages of the invention are accomplished by a method of testing an electronic component that draws large current during normal operation, comprising the steps of: (a)providing said electronic component having a plurality of ground and power contacts; (b)providing a power supply; (c)providing a plurality of contactors for electrically contacting said plurality of ground and power contacts on said electronic component wherein a first of said power or ground contactors is not connected to said power supply when others of said plurality of ground and power contactors are connected to said power supply; (d) connecting said first power or ground contactor to a monitoring device; (e)connecting others of said plurality of power and ground contactors to said power supply for providing a power supply voltage to said electronic component; (f) providing a signal to operate said electronic component so it draws a large current; and (g)detecting a voltage on said monitoring device to determine a difference between said detected voltage and said power supply voltage.

Testing may be interrupted and the contacts cleaned before testing is resumed if the difference between the detected voltage and the power supply voltage is more than a predetermined value. Further, test parameter corrections may be made based on the differential measurement.

The method further comprises providing a layered substrate with a top surface and a bottom surface, the top surface having conductive lands for electrical contact to the electronic component, the bottom surface having conductive lands for mounting solder connections. Also, providing a contactor for contacting the plurality of ground and power contacts, further comprises contacting the solder connections to the contactor. In providing a contactor, the method further comprises providing a layered printed circuit board, the layers being conductive and isolated from each other for power, ground and signal planes, with a pogo pin array inserted within the printed circuit board, the pogo pins individually connected to the conductive layers and contacting the solder connections on the bottom surface of the substrate. Lastly, the method provides an alignment mechanism for aligning the plurality of ground and power contacts on the electronic component with the pogo pins on the contactor.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT

Figure 1:
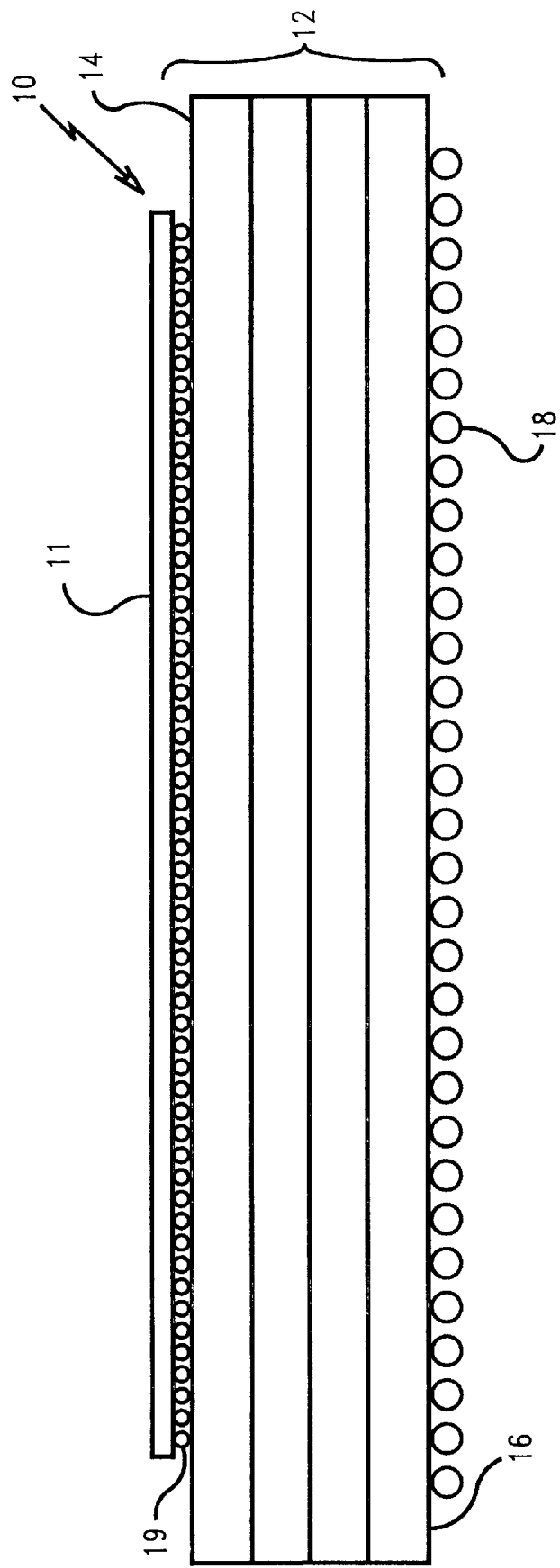
FIG. 1 is a cross sectional view of an electronic module consisting of an integrated circuit chip on the top surface of a multilayered substrate.

In describing the preferred embodiment of the present invention, reference will be made herein to FIGS. 1–10 of the drawings in which like numerals refer to like features of the invention. Features of the invention are not necessarily shown to scale in the drawings.

The electronic module tester, discussed herein, was developed to specifically test microprocessor integrated circuits (ICs) in manufacturing. However, application of this tester and testing method can be made to other electronic modules.

FIG. 1 shows electronic module 10 consisting of integrated circuit chip (IC) 11 mounted on layered ceramic substrate 12. Substrate 12 has a top surface 14 and a bottom surface 16. Bottom surface 16 has solder balls 18 attached for external connection. Connection of integrated circuit chip 11 to ceramic substrate 12 is through solder balls 19, that are attached to lands on top surface 14 of ceramic substrate 12. Internal signals and power planes are routed through layers of substrate 12 to connect solder balls 19 of IC chip 11 to solder balls 18 on bottom surface 16 of ceramic substrate 12.

Figure 2:
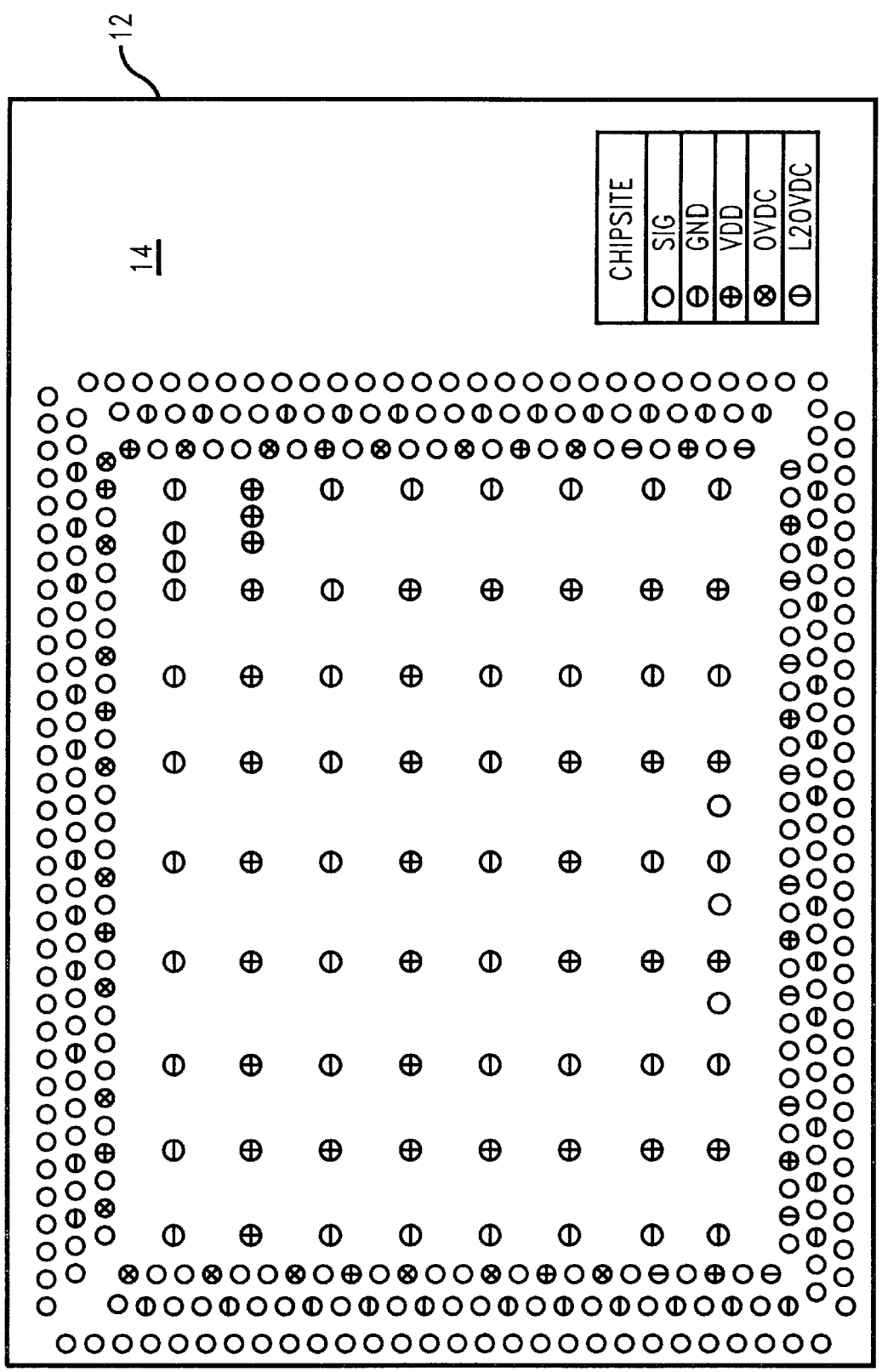
FIG. 2 is a planar view of the solder ball layout on the bottom surface of the integrated circuit.
Figure 4:
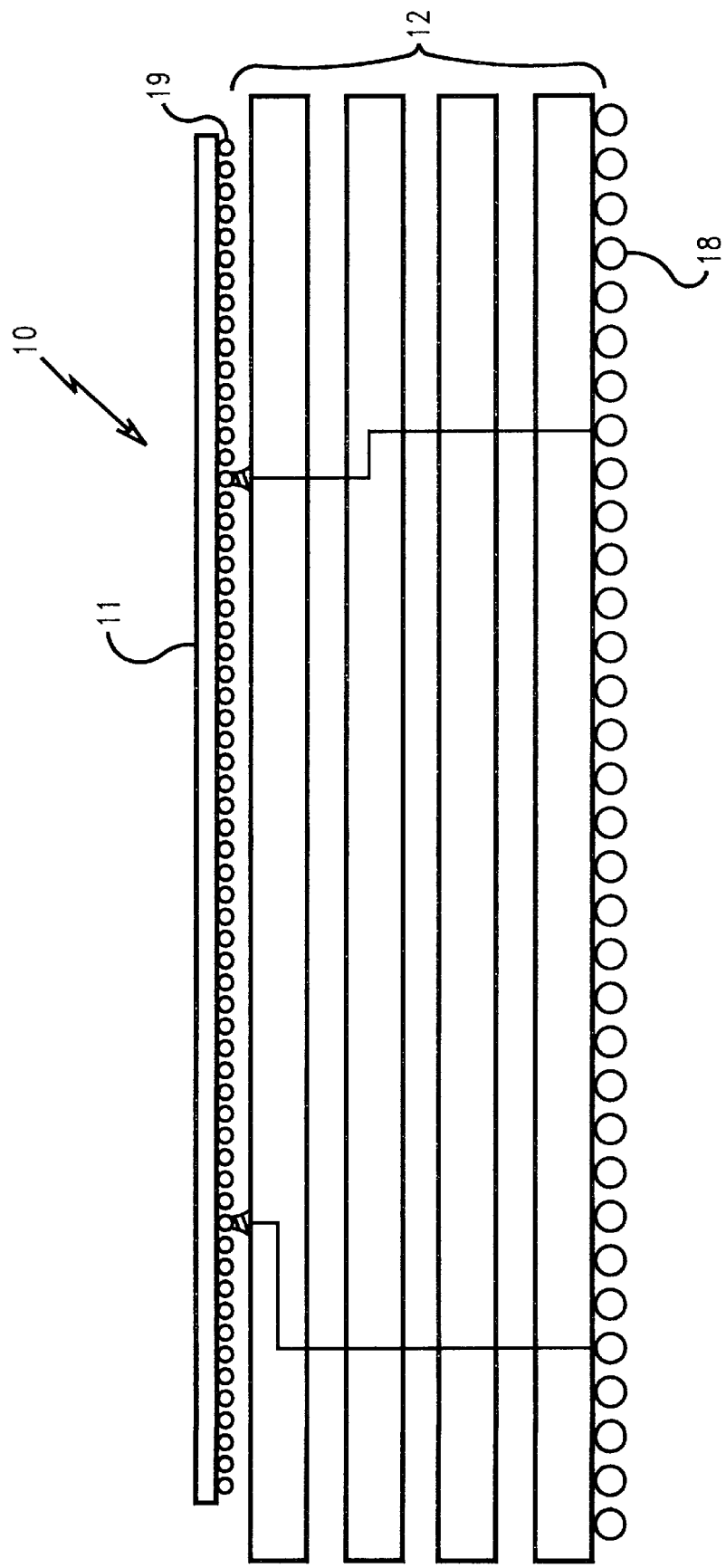
FIG. 4 is a cross-sectional view of the multilayered substrate contacting an electronic module depicting the interconnections for a representative one of the power and a representative one of the ground lines (the other signal lines have been omitted for clarity).
Figure 5:
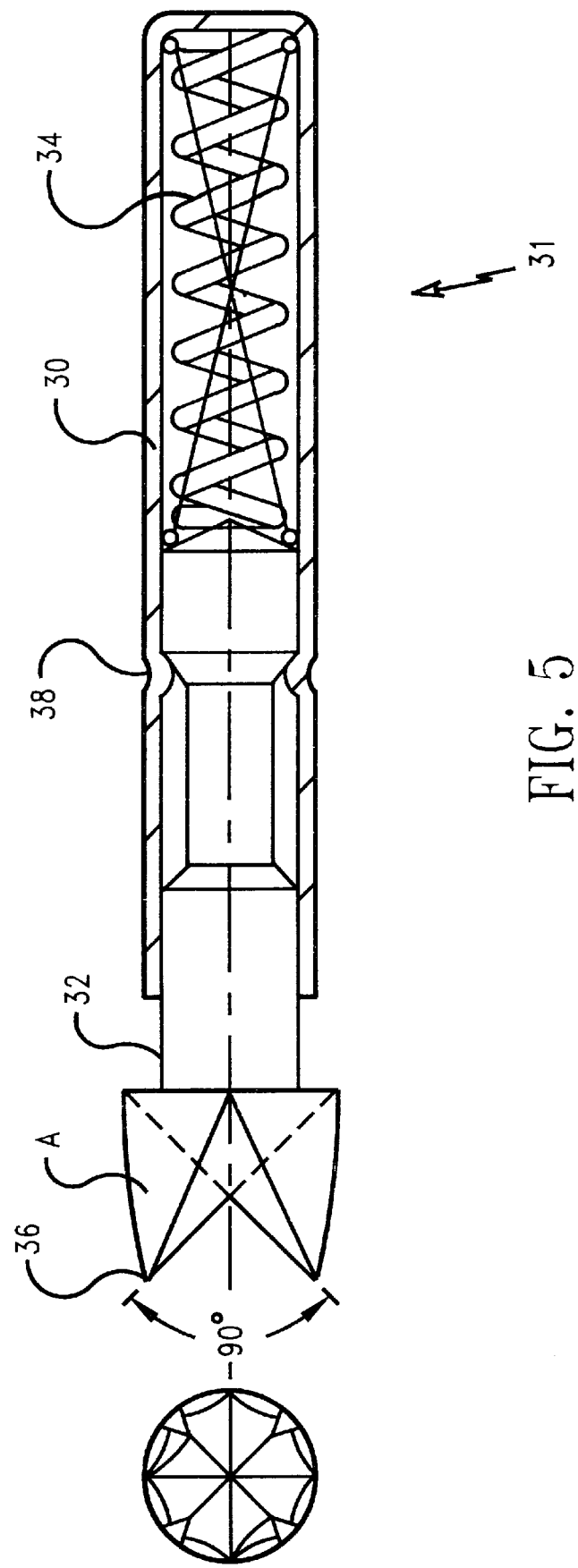
FIG. 5 is a cross section view of a pogo pin assembly.

FIG. 2 is a layout of power (VDD), ground (GND) and signal (SIG) solder balls 19 of IC 11. The solder balls labeled with + are connected to the Vdd power plane 22 in IC chip 11. The solder balls labeled with − are connected to the GND ground plane 24 in IC chip 11. All of the + pads are shorted to each other and all of the − pads are shorted to each other through their respective planes internal to IC chip 11. These + and − pads are also shorted together through respective power planes in substrate 12 (FIG. 4). For illustrative purposes, IC chip 11 is shown with fifty (50) power pads VDD and eighty-seven (87) ground pads GND connected to substrate planes. In addition chip 11 has signal pads SIG, and off chip driver power supply pads OVDC and L20VDC. The off chip driver power supply pads draw little current and the voltage chip 11 receives on these pads is not sensitive to contact contamination. VDD and GND pads draw large currents during operation and therefore are sensitive to contact contamination.

Figure 3:
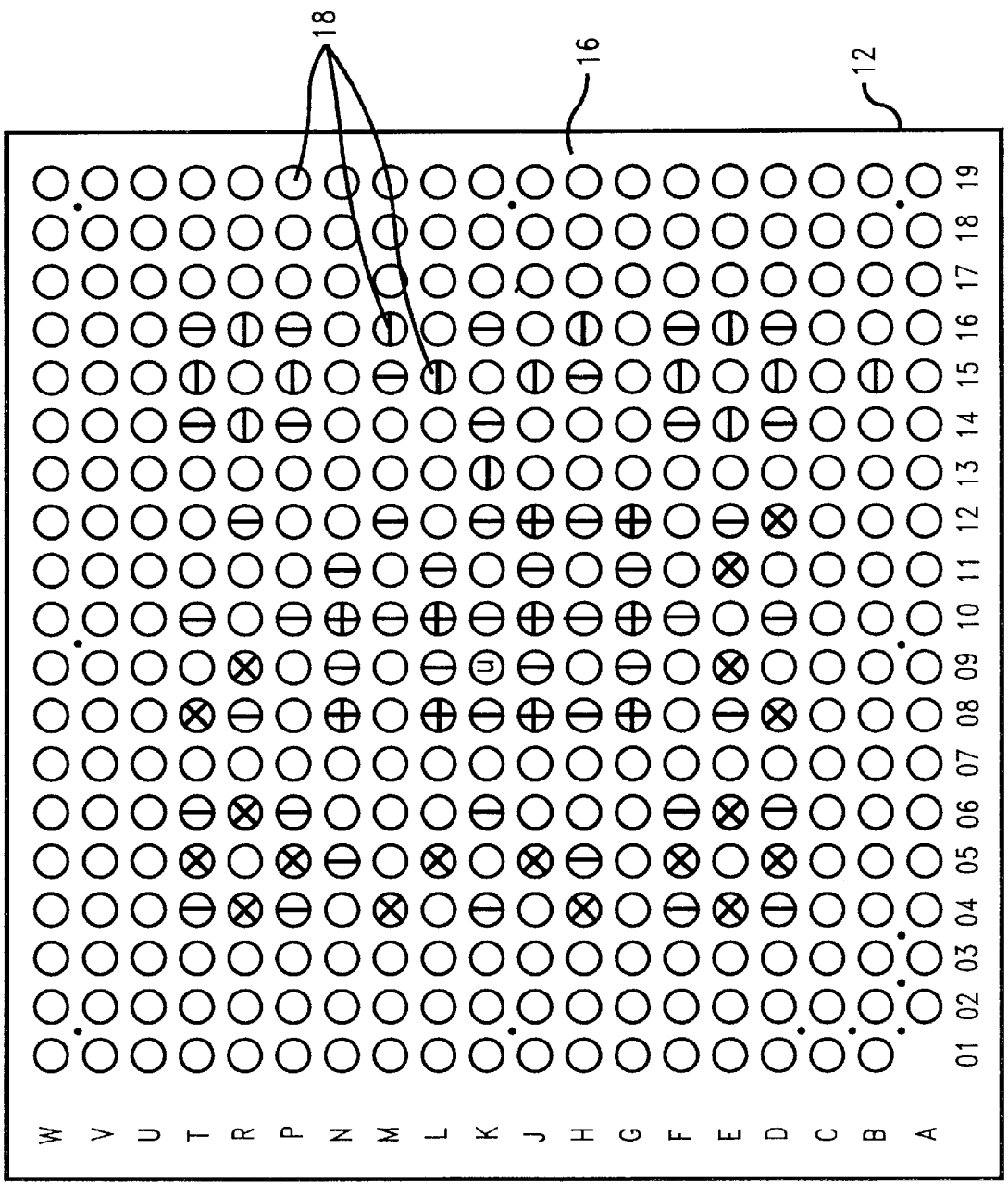
FIG. 3 is a bottom view of the multilayered substrate with lands identified for power, ground and signal solder balls connected through the substrate to the integrated circuit chip.

FIG. 3 is a layout of solder balls 18 on bottom surface 16 of multilayered substrate 12. Solder balls 18 are electrically connected through the layers in substrate 12 to lands on top surface 14 of substrate 12 where connections to IC solder balls 19 are made.

FIG. 4 is a cross-sectional view of IC 11 mounted on top surface 14 of multilayered substrate 12 showing representative connections through the layers of substrate 12 between IC solder balls 19 on top surface 14 and the ball grid array of solder balls 18 on bottom surface 16 of substrate 12.

FIGS. 5a, 5b depict a pogo pin contactor 31 including cup or sleeve 30, spring 34, and contact shaft 32 that comes to a multi-pointed head 35 at end 36. Contact shaft 32 slides inside sleeve 30 to allow for variation in the overall length of pogo contactor 31. Sleeve 30 of pogo pin 31 is soldered into plated through-hole 33 in printed circuit board 40 (FIGS. 6a and 6b) to make electrical connection to the proper signal path to a tester. Roll crimp 38 holds shaft 32 in place and limits the extension of spring 34.

Figure 6A:
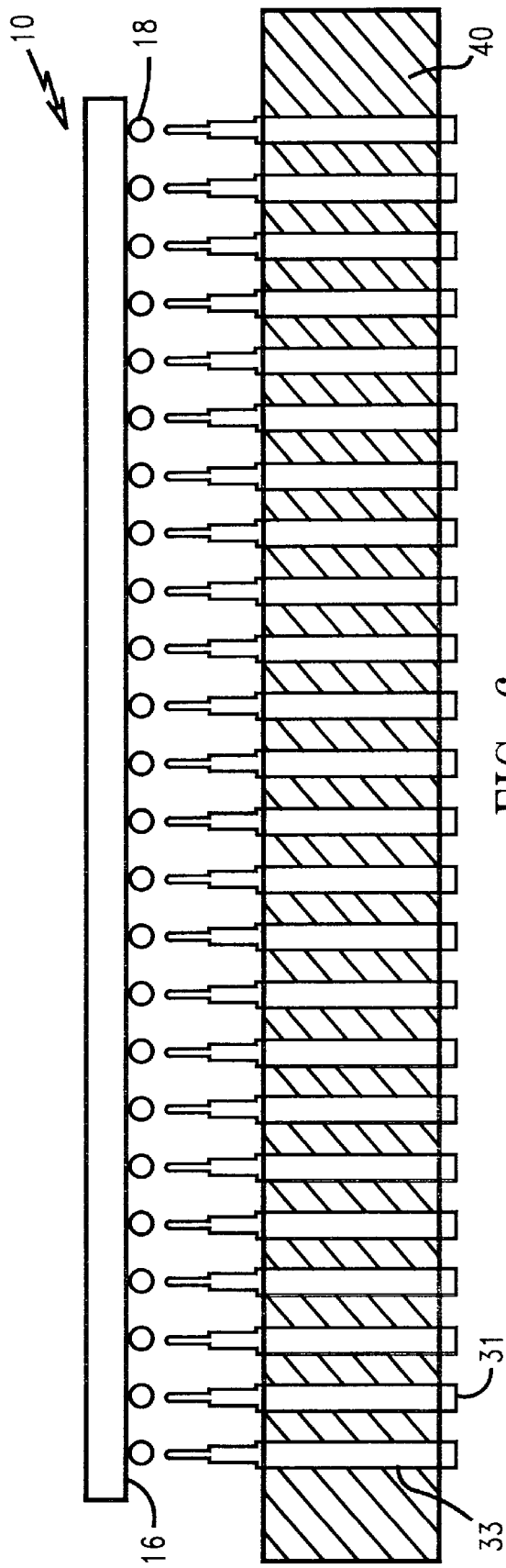
FIG. 6a is a cross-sectional view of an array of pogo pins as placed in a printed circuit board prior to contact with an electronic module.

FIG. 6a shows a cross-sectional view of module 10 before being placed in contact with an array of pogo pin contactors 31. Pogo pins 31 are arranged in printed circuit board 40 with the same spacing as solder balls 18 on bottom surface 16 of substrate 12. There is one pogo pin 31 for each solder ball 18. Electrical connection is made to pogo pin sleeve 30 mounted in hole 33 in printed circuit board 40 to supply the proper signal to the proper pad on substrate 12.

Figure 6B:
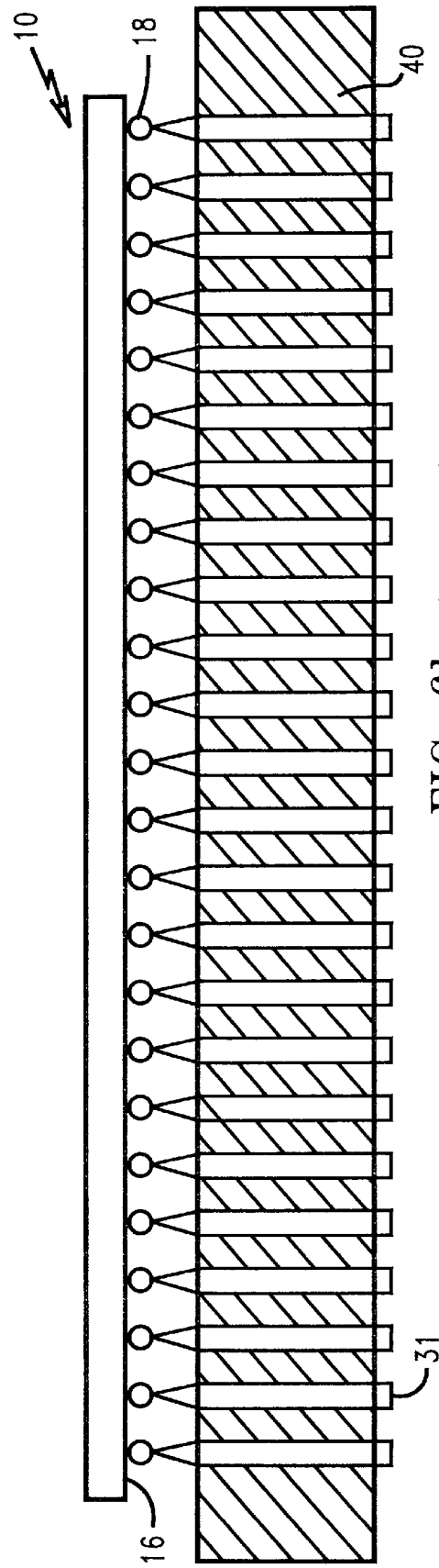
FIG. 6b shows the substrate and module of FIG. 6a in the contacted state.

FIG. 6b shows solder balls 18 of module 10 being contacted by array of pogo pins 31 showing the compression of the pogo pins as they make contact.

Figure 7:
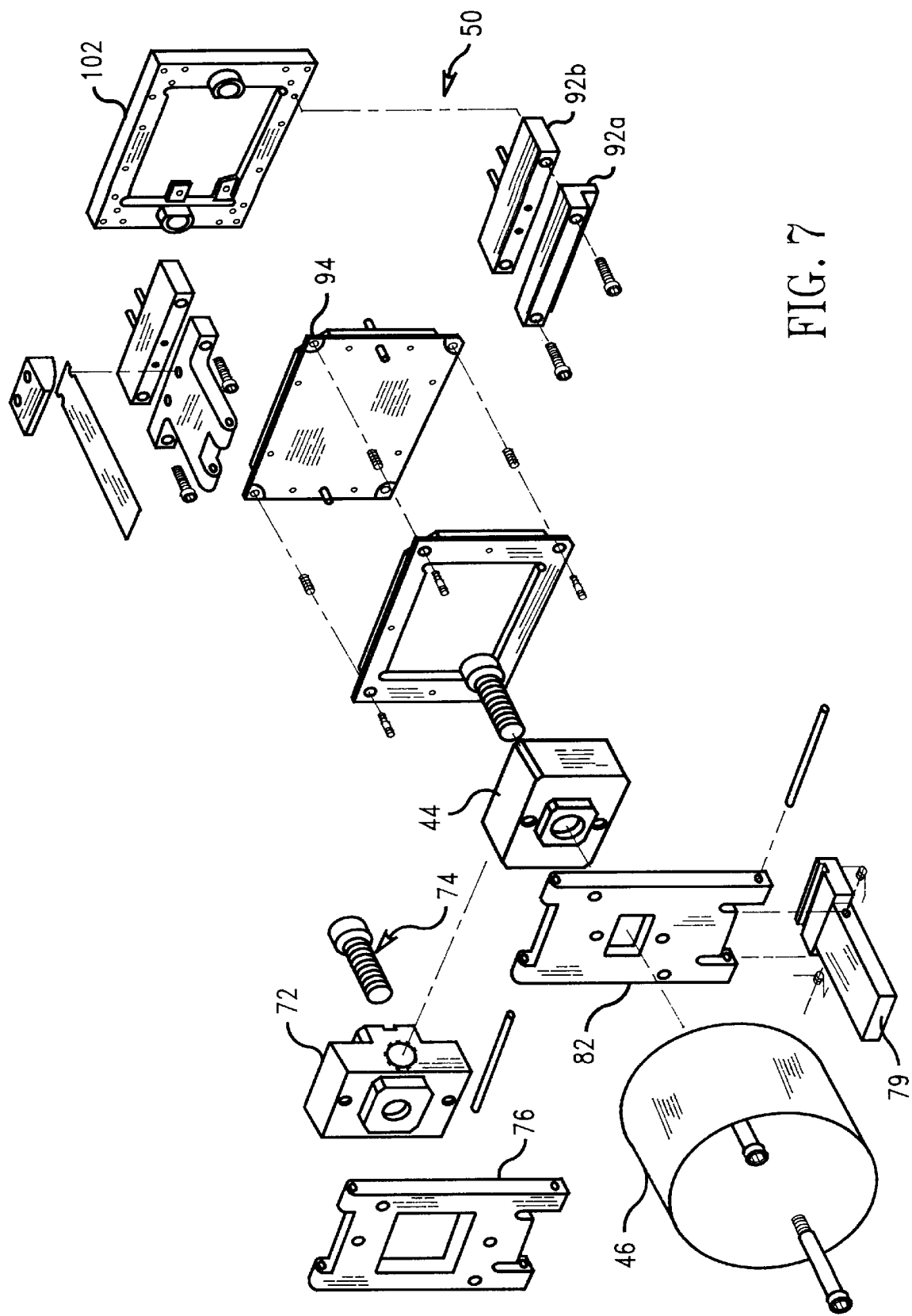
FIG. 7 is an assembly drawing of the mechanism that aligns the module with the pogo pins and applies pressure to the module to force the substrate solder balls onto the pogo pins.

FIG. 7 shows module alignment mechanism 50 that aligns solder balls 18 on bottom surface 16 of substrate 12 with pogo pins 31. Alignment mechanism 50 includes heated plunger 72 attached by plunger screw 74 to thermal plate 76. Latch pin 78 holds latch 79 to top plate 82. A force is exerted on module 12 by plunger 44, acted upon by air solenoid 46, pushing the supported module down onto pogo pins 31 in printed circuit board 40 (not shown) mounted on tester base 102. Module 12 is supported by plate 94 with front plate 92a and back plate 96a. Springs 34 in pogo pins 31 maintain a fixed counter force. Once attached, module solder balls 18 are in electrical contact with pogo pins 31 in printed circuit board 40 located in tester base 102, and power and signals are passed through this interface.

Figure 8:
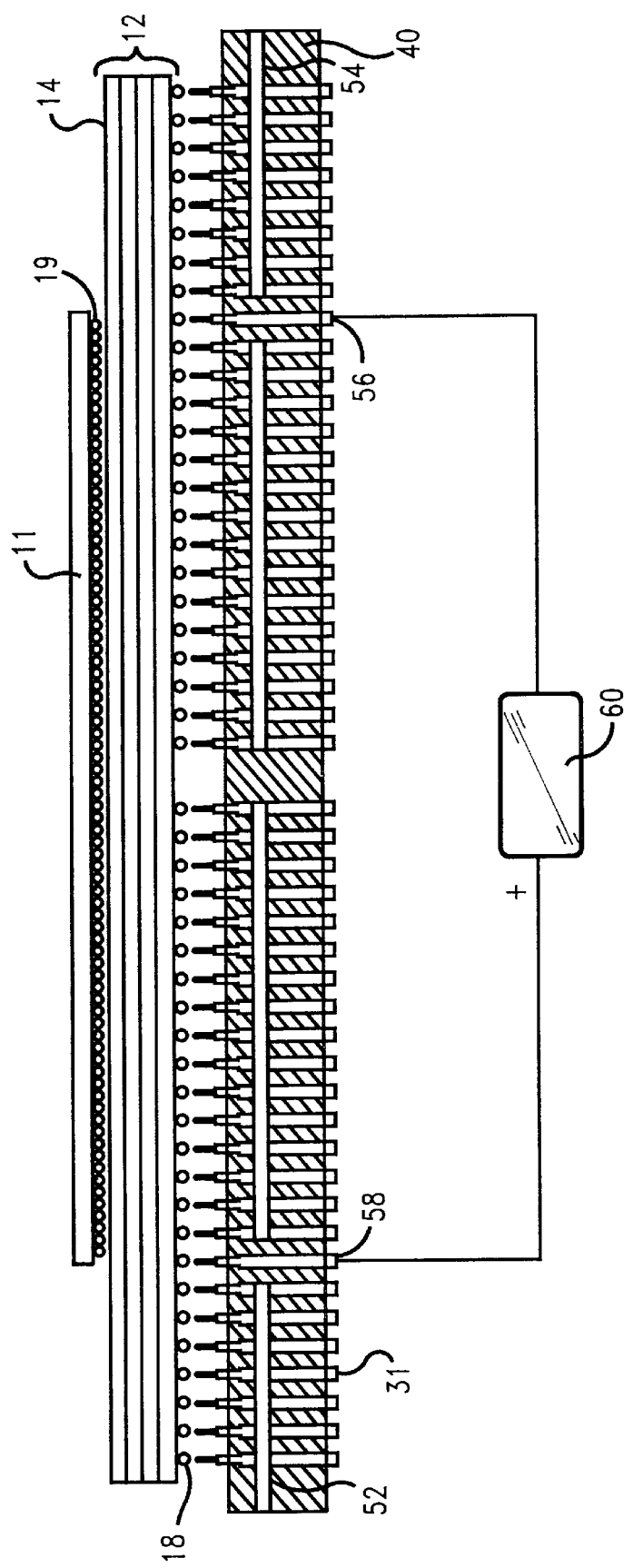
FIG. 8 is a cross sectional view of the placement of the electronic module on the pogo pin contactor of the present invention in which isolated pogo pins are identified and are schematically connected to the measurement unit and remaining power and ground pogo pins are connected to their respective power and ground planes in the multilayered substrate.

FIG. 8 shows a cross-sectional view of module 10 in contact with array of pogo pins 31 as mounted on printed circuit board 40. The present invention provides isolated pogo pins 58 that are not connected to power plane 52 and ground plane 54 in printed circuit board 40. There is an electrical connection from isolated pins 56, 58 to measurement system 60 for measuring the differential voltage between two pogo pins 56, 58. Solder balls 18 that these pogo pins 56, 58 contact are connected through substrate 12 to internal power bus 24 and ground bus 22 in IC chip 11. Power is supplied to module 10 through all remaining pogo pins 31 which are connected to power plane 52 and ground plane 54 in printed circuit board 40.

Figure 9:
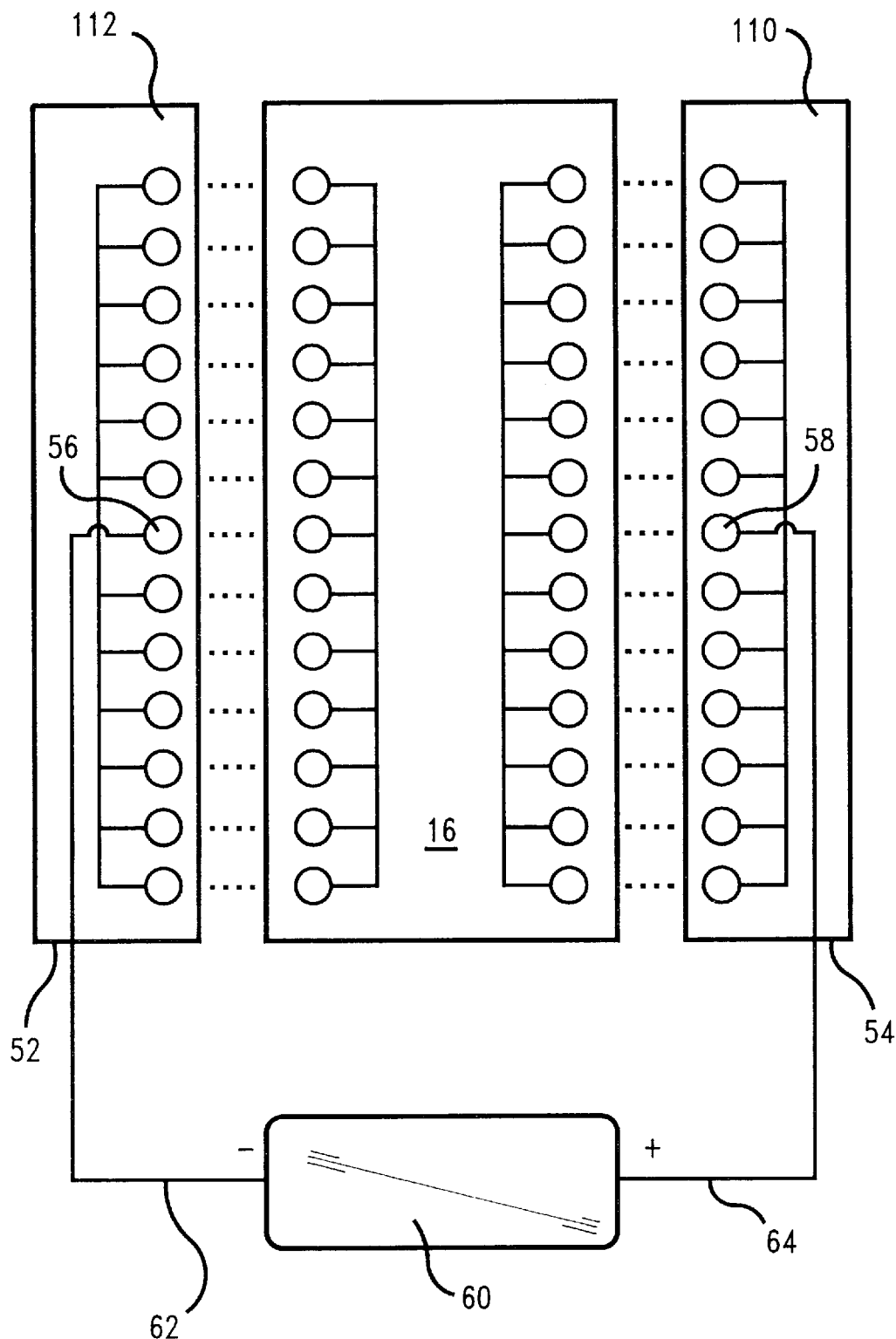
FIG. 9 is a schematic of the power delivery configuration of the current invention shown in FIG. 8.

FIG. 9 is a schematic of the electrical connection between power bus 24 and ground bus 22 internal to IC chip 11 and power plane 52 and ground plane 54 in printed circuit board 40 through pogo pins 31. Pogo pins 31 are all connected to power plane 52 or ground plane 56 while individual pogo pins 56 and 58 are isolated from these planes and connected to voltmeter 60. (Signal pins are omitted for clarity.)

Figure 10:
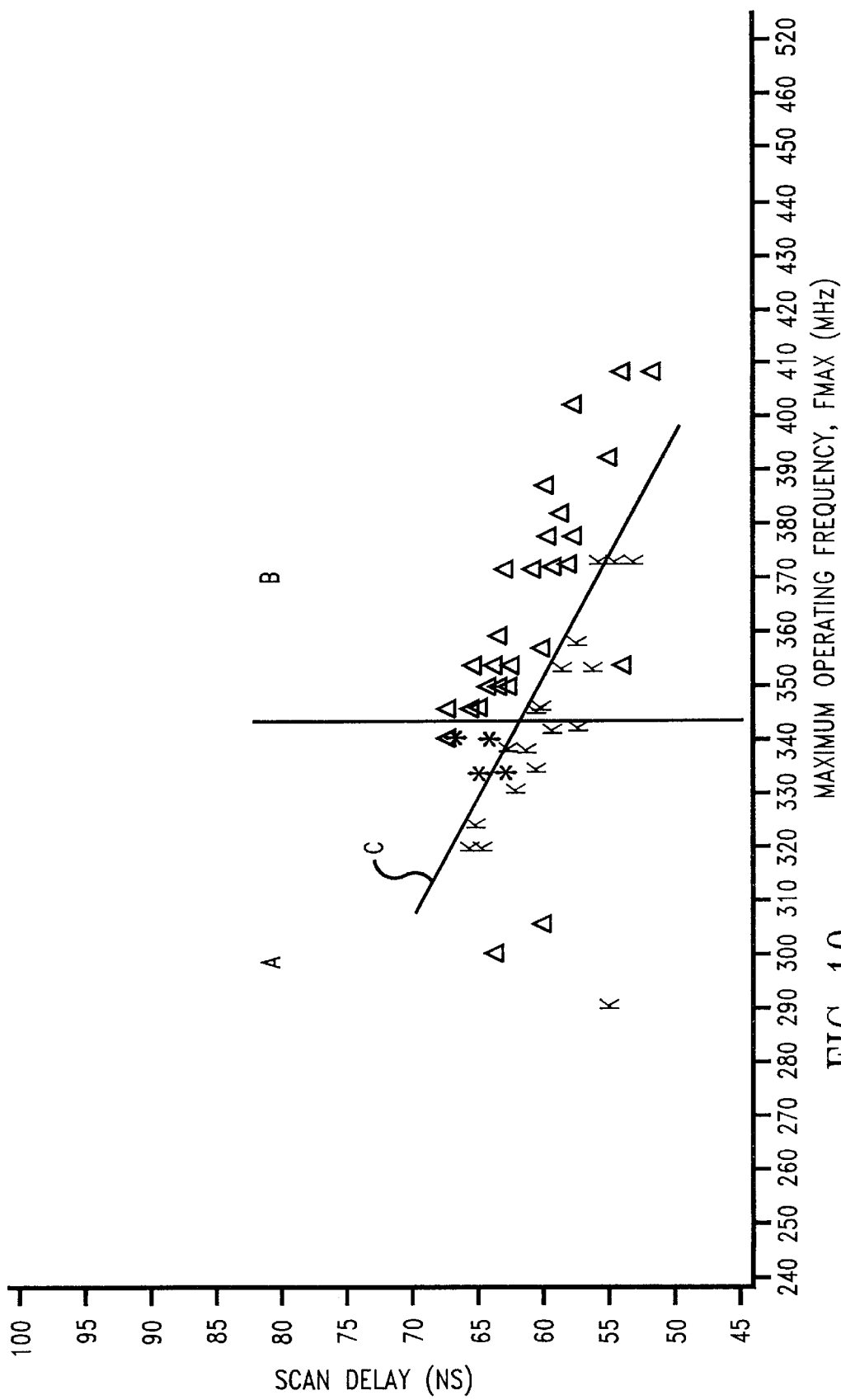
FIG. 10 is a graph of scan delay measurements and maximum frequency measurements.

FIG. 10. graphically shows two speed test results for each high frequency microprocessor in a lot. Each microprocessor was tested using twice using two different methods, one a low current method, the second a high current method. The first method takes advantage of the fact that processors under test had scan chains through the logic blocks, accessible by test pins. The scan chains are made up of thousands of latches. The latches can be put in a mode where activating one latch in the chain sets off the next latch in the chain in a "domino" fashion. The scan delay test inputs a pulse signal into one end of the latch chain and measures the time for the pulse signal to propagate through all the logic blocks and finally appear at the other end of the chain of logic blocks. This measurement has a direct correlation to the maximum operating frequency of the internal logic blocks. The shorter the time interval, the faster the processor will operate.

The second test method, called the Fmax test, involves operating the module in full functional mode. Because of the rapid switching very high currents are drawn by each processor in this test.

The scan delay test is a logic diagnostic test, and as such, the electronic module is not running in a functional configuration. Therefore, it does not draw much current from the power supply (less than 100 milliamps). Because current is low, there is no significant voltage drop (V=IR) across the pogo pin/solder ball grid contact even when this contact is fairly resistive. In contrast, the Fmax test runs the processor in full functional mode drawing the maximum power supply current (approximately 10 amps). A small contact resistance can now provide a large IR drop, lowering the voltage actually applied to the chip, and slowing it down.

Without contact resistance, the results from the two tests should track from module to module. That is modules scoring higher on the low current test should also score higher on the high current test. However, if contact resistance is a problem, some modules should appear to run slower on the high current Fmax test than they should run given their scan chain results.

In FIG. 10 data is plotted for both speed measurements for each module in the lot. The low current scan delay speed is tracked on the ordinate, and the high current maximum measured operating frequency, Fmax, on the abscissa, and the two measurements for each module are plotted in the graph.

The plot identifies the boundary between 350 MHz "fast" parts (region B) and 333 MHz "medium" parts (region A). The points denoted with the symbol "K" represent modules that did not have a proper correlation between the scan delay measurement results and the Fmax measurement results. These modules scored lower than counterparts on the high current Fmax test given their scores on the scan delay test. The faster scan delay points should have been shifted to the right to line up with Fmax scores for modules that had similar scan delay scores.

The faster parts draw higher currents and are the most sensitive to power supply voltage levels actually applied. Many of the K-designated parts are actually fast enough to have been sorted into the high speed group. However, contact resistance reduced the voltage applied to these modules and the population tested with high contact resistance shifted to the left of sloped line C. Many of them would therefor be measured as lower speed modules, speed sorted to the lower speed bin, and sold as slower devices.

To illustrate the effect of contact resistance, if there are twelve power pins available for contact and the contact resistance is on the order of 24 milliohms per pin, then the overall contact resistance in series with the power supply is on the order of 2 milliohms. When the electronic device is in a static state, i.e., with no clocks running, the power supply current requirements are extremely low, typically less than 20 milliamps. However, when the electronic device is running at full functional speed, the power supply current requirements average approximately 10 amps. Consequently, the 2 milliohm contact resistance will drop the voltage to the device by about 20 millivolts (10 amps×2 milliohms).

An unacceptable variance occurs when the contact resistance at the pogo pin/solder ball interface increases to the hundreds of milliohms range; a consequence of contamination build-up at the contact interface. The device will continue to draw sizable currents even if the voltage it receives is somewhat reduced.

If the contact resistance at the pogo pin/solder ball contact increased to 240 milliohms per pin, then the overall resistance of 12 pins will be 20 milliohms, and the device would see close to a 200 millivolt drop on its supply line. Thus, it would actually be operating at a substantially lower voltage than specified for the test. Typically, microprocessors operating frequency tracks with the voltage supplied. The slope for the maximum frequency is about 8 MHz per 100 millivolts. Thus, contamination causing 20 milliohms of contact resistance for a module drawing 10 amps will cause a voltage drop of 200 millivolts, and this will cause the microprocessor to run 16 MHz slower from if the voltage was not reduced by contact resistance.

The present invention specifically addresses the problem of determining when the contacts have become sufficiently contaminated to interfere with the device's performance, without disturbing the test environment. Referring to FIGS. 8 and 9, one power supply pin 58 and one ground pin 56 are removed from contact with tester PC board power plane 52 and ground plane 54, respectively, so that an isolated path to the power bus 22 and ground buses 24 on IC chip 11 is available. These isolated pins 56, 58 are then connected to voltmeter 60 to measure the actual voltage on module 10 and IC chip 11 while module 10 is in full functional operation. Voltmeter 60 does not draw current, so the resistance in the voltmeter's path does not have an effect on the measurement.

The results obtained from the above described measurement are then used to evaluate the effects of the contact resistance caused by contamination at the interface. The measurement is compared to the power supply voltage that is forced on the tester power and ground planes. Depending on the device under test, the results of this test may indicate various alternative actions. For example, when the voltage difference is significant, high current devices would require test suspension and contact cleaning, since the voltage drop would be non-negligible at these current levels. A predetermined limit for the allowable measured voltage differential may be set for ease of application, such as 50 millivolts.

In a manufacturing environment, a voltmeter reading is made at the onset of the test sequence with the test operator determining the stop or continue status based on a predetermined screening level. The procedure may designate no more than a certain number of high current readings before testing is halted and the test fixture removed and cleaned.

The present invention differs from the standard 4-terminal or 4-point probe measurement in that the current being drawn by the device under test is unknown. The value being sought (directly) is no longer the impedance or contact resistance, but only the difference between the voltage actually delivered to the module (as measured through the isolated pins on the module under test) and the power supply voltage. The test is most sensitive when the devices are drawing large currents, as in devices running in their normal mode of operation. The measurement identifies the detrimental effect of contact contamination without measuring actual contamination resistance (since the transient current drawn by the module may not be measured).

This measurement apparatus and method may be generally applied to any surface contact maintained by pressure. It may also be used for voltage monitoring of wafers while being stimulated by probes, or in any pogo pin to PC board arrangement.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of testing an electronic component that draws large current during normal operation, comprising the steps of:
   a) providing said electronic component having a plurality of ground and power contacts;
   b) providing a power supply;
   c) providing a plurality of contactors for electrically contacting said plurality of ground and power contacts on said electronic component wherein a first of said power or ground contactors is not connected to said power supply when others of said plurality of ground and power contactors are connected to said power supply;
   d) connecting said first power or ground contactor to a monitoring device;
   e) connecting others of said plurality of power and ground contactors to said power supply for providing a power supply voltage to said electronic component;
   f) providing a signal to operate said electronic component so it draws a large current; and
   g) detecting a voltage on said monitoring device to determine a difference between said detected voltage and said power supply voltage.

2. The method of claim 1 wherein said providing step (c) comprises both a first of said power contactors and a first of said ground contactors not being connected to said power supply when others of said plurality of ground and power contactors are connected to said power supply, and wherein said connecting step (d) comprises connecting both said first power contactor and said first ground contactor to said monitoring device.

3. The method of claim 1 further comprising the step of interrupting testing and cleaning said contactors before testing is resumed if said difference between said detected voltage and said power supply voltage is more than a predetermined value.

4. The method of claim 1 further comprising correcting a test parameter based on said difference.

5. The method of claim 1 wherein said monitoring device is a voltmeter or a voltage comparator.

6. The method of claim 1 wherein said electronic component comprises an array of solder balls for external contact.

7. The method of claim 6 wherein said step (c) comprises contacting said solder balls with said contactors.

8. The method of claim 1 wherein said step (c) comprises providing a plurality of pogo pins and a printed circuit board having power, ground and signal conductors, said pogo pins individually connected to said conductors.

9. The method of claim 8 further comprising the step of providing an alignment mechanism for aligning said plurality of ground and power contacts on said electronic component with said pogo pins.

10. A method of testing, comprising the steps of:
    a) providing a clocked electronic component;
    b) supplying a power supply voltage from a power supply to power and ground contacts of said component through contactors to said electronic component;
    c) operating said component to provide dynamic switching of said component wherein large currents may be drawn from said power supply through said contactors during each said switch; and
    d) comparing a voltage on said component with said power supply voltage during said operating step without automatically compensating said power supply for a difference between said component voltage and said power supply voltage.

11. The method as recited in claim 10 wherein said voltage comparing step (d) comprises the step of measuring a power-to-ground voltage on the component and comparing with the power supply power-to-ground voltage as supplied by said power supply.

12. The method as recited in claim 10 wherein said voltage comparing step (d) comprises the step of measuring the voltage between a high voltage pad on the component with the power supply high voltage as supplied by said power supply.

13. The method as recited in claim 10 wherein said voltage comparing step (d) comprises the step of measuring the voltage between a ground pad on the component with the power supply ground as supplied by said power supply.

14. The method as recited in claim 10 further comprising the step of cleaning said contactors if said component voltage differs from said power supply voltage.

15. The method as recited in claim 10 wherein in said comparing step (d) voltage is compared between a contactor of voltage supplying step (b) and another contactor to one of said power and ground contacts, said other contactor not carrying current from said power supply.

16. An electronic component tester for testing an electronic component that draws large current during normal operation, the component having a plurality of power, ground, and signal contacts, comprising:
    a power supply with an output voltage;
    a plurality of contactors for facilitating contact between said plurality of power and ground contacts of said electronic component and said power supply wherein one of said first power contactors and said first ground contacts are not connected to said power supply when said plurality of power and ground contactors are connected to said power supply; and
    a monitoring device connected to said disconnected first ground contactor or said first power contactor for measuring a voltage on said electronic component and determining a difference between said voltage on said electronic component and said power supply output voltage, when said electronic component is operating.

17. The apparatus of claim 16 wherein said monitoring device comprises a voltmeter or a comparator.

18. The apparatus of claim 16 wherein said electronic component comprises an array of solder balls for external contact.

19. The apparatus of claim 18 further comprising an alignment mechanism for supporting said electronic component and for aligning said solder balls to make electrical contact with said contactors.

* * * * *